United States Patent
Nickel

(10) Patent No.: US 8,028,743 B2
(45) Date of Patent: Oct. 4, 2011

(54) PASSIVE COOLING IN RESPONSE TO AMBIENT ENVIRONMENTAL PROPERTIES

(75) Inventor: Janice H Nickel, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 266 days.

(21) Appl. No.: 12/249,568

(22) Filed: Oct. 10, 2008

(65) Prior Publication Data

US 2009/0260796 A1   Oct. 22, 2009

Related U.S. Application Data

(60) Provisional application No. 61/045,811, filed on Apr. 17, 2008.

(51) Int. Cl.
*F28F 7/00* (2006.01)

(52) U.S. Cl. .......... 165/80.2; 165/287; 239/13; 239/75; 239/551; 239/566; 239/571

(58) Field of Classification Search ............... 239/551, 239/566, 571, 13, 75; 137/79, 81.1; 165/287, 165/80.2
See application file for complete search history.

(56) References Cited

U.S. PATENT DOCUMENTS

| | | | | |
|---|---|---|---|---|
| 4,350,271 A * | 9/1982 | Eckenhoff | ............... | 222/386.5 |
| 5,498,255 A * | 3/1996 | Wong | ............... | 604/892.1 |
| 5,740,970 A * | 4/1998 | Edwards | ............... | 239/551 |
| 5,997,527 A * | 12/1999 | Gumucio et al. | ............... | 604/892.1 |
| 6,682,522 B2 * | 1/2004 | Carr et al. | ............... | 604/892.1 |

* cited by examiner

*Primary Examiner* — Dinh Nguyen

(57) ABSTRACT

A system for passively cooling an electronic component includes a conduit configured to carry a pressurized cooling fluid. The conduit has a plurality of delivery orifices configured to dispense the pressurized cooling fluid from the conduit to cool the electronic component. Each delivery orifice has a hydrogel mechanism associated therewith, which is configured to individually control each of the plurality of delivery orifices to automatically regulate flow of the cooling fluid in response to a variation in a property of an ambient environment surrounding the hydrogel mechanism. The property of the ambient environment is influenced by an operation of the electronic component.

20 Claims, 5 Drawing Sheets

PASSIVE COOLING IN RESPONSE TO AMBIENT ENVIRONMENTAL PROPERTIES

CROSS-REFERENCE TO RELATED APPLICATION

The present application claims priority from provisional application Ser. No. 61/045,811, filed Apr. 17, 2008, the contents of which are incorporated herein by reference in their entirety.

BACKGROUND

Various systems require the adjustment of environmental conditions to function at or near optimal levels. For example, many electronic and mechanical systems operate inefficiently, or will even fail, in the presence of excessive heat. This problem is exacerbated by the fact that most electronic and mechanical systems generate their own heat as a by-product of their operation. Therefore, a cooling system is desirable to decrease the heat in such electronic and mechanical systems. Similarly, alkalinity, humidity, and other environmental properties also affect various electronic, mechanical, chemical, and biological systems.

With the advent of more powerful electronic components having increasingly large component densities, the removal of heat, in particular, has become an increasingly challenging technical issue. Furthermore, typical processor boards can, in some instances, include multiple central processing modules (CPUs) modules, application-specific integrated circuits (ASICs), and static random access memory (SRAM), ac/dc converters, as well as other components, which may all contribute to the generation of heat. Heat sinks are often employed to increase the heat-dissipating surface area of such devices. However, heat sinks, and their interfaces to the electronic components, often interfere in the heat flow, which often leads to uneven cooling.

Other known cooling methods for electronic components include free-flowing and forced-air convection, free-flowing and forced-liquid convection, pool boiling (that is, boiling a liquid cooling fluid off of a submerged device), and spray cooling (that is, boiling a liquid cooling fluid off of a device being sprayed with the liquid). Because liquids typically have a high latent heat of vaporization, these latter two methods provide for a high heat-transfer efficiency, absorbing a large quantity of heat at a constant temperature. Typically, the cooling fluid used has a relatively low boiling point and is inert to the heat source.

Current spray cooling systems employ either pressurized liquid spraying or pressurized gas atomizing. Both techniques require the use of mechanical valves, which must be monitored, controlled and actuated by electronic and/or physical means. Thus, separate systems are generally required to facilitate spray cooling of electronic components. These additional monitoring and control systems add undesirable complexity and expense to cooling systems, while also adding another device that may require maintenance. Moreover, in electronic systems where space is a premium, additional monitoring and controls systems consume valuable real estate and increase the size of electronic systems.

BRIEF DESCRIPTION OF DRAWINGS

The embodiments of the invention will be described in detail in the following description with reference to the following figures.

DETAILED DESCRIPTION OF EMBODIMENTS

Figure 1:
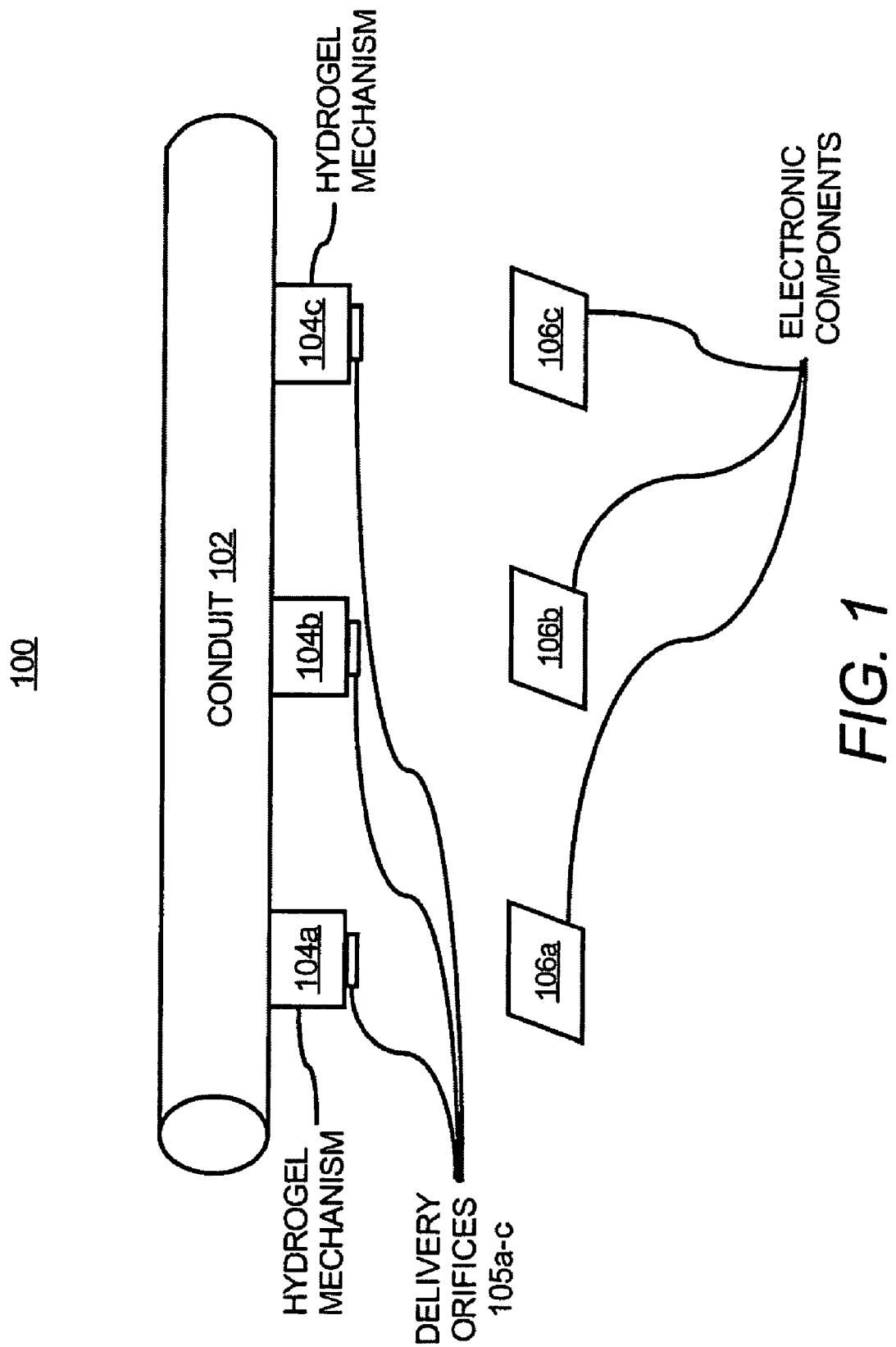
FIG. 1 illustrates a simplified view of a passive cooling system, according to an embodiment.

For simplicity and illustrative purposes, the principles of the embodiments are described by referring mainly to examples thereof. In the following description, numerous specific details are set forth in order to provide a thorough understanding of the embodiments. It will be apparent however, to one of ordinary skill in the art, that the embodiments may be practiced without limitation to these specific details. In some instances, well known methods and structures have not been described in detail so as not to unnecessarily obscure the embodiments.

According to an embodiment, the systems and methods described herein provide for passive cooling of an electronic component based on localized ambient environmental properties. The systems and methods for passive cooling may utilize a conduit configured to transport a pressurized cooling fluid. The term "fluid" refers to either or both liquid and gaseous states and the cooling fluid may include any reasonably suitable compound or mixture, including air, water, and other coolants, such as various glycols. The cooling fluid may be emitted from the conduit through a plurality of delivery orifices in the conduit, which may comprise a gateway configured to be opened and closed to selectively regulate the flow of the cooling fluid from the conduit.

The delivery orifices are controlled by a hydrogel mechanism. The term "hydrogel mechanism" refers to a device that is capable of regulating the flow of the cooling fluid through the delivery orifices passively with the use of a hydrogel material. A hydrogel material is a material capable of altering its physical state, such as volume or permeability, in response to a change in a property of an ambient environmental. For example, hydrogels may expand, contract, become more/less porous, etc., in response to a change in a property of the ambient environment, such as temperature, pressure, humidity, pH, etc. In this manner, the hydrogel material acts as both a sensor to detect a change to a property of an ambient environment and, in various embodiments, as an actuator, because by altering a state in response to the detected change the hydrogel material may physically move other devices, or otherwise cause cooling fluid to flow from the conduit through the delivery orifices. Therefore, the hydrogel mechanisms passively control the flow of the cooling fluid because local environmental conditions automatically activate the hydrogel material to control the delivery orifices. As such, the flow of cooling fluid from the conduit is regulated automatically based on the surrounding environmental conditions without the need for additional control mechanisms.

In an embodiment, a hydrogel mechanism may control a plurality of delivery orifices. Alternatively, or in addition thereto, each delivery orifice may be individually controlled by a separate hydrogel mechanism. In this manner, the systems and methods may provide targeted cooling to a particular electronic component or only a portion of a particular electronic component that requires cooling. While the term "electronic component," is used herein in the singular tense, a person having ordinary skill in the art will appreciate that a plurality of electronic components may also be cooled by release of the cooling fluid from one or more of the delivery orifice(s). In addition, the systems and method described herein may be used to cool non-electronic components, as will be described in greater detail below.

The embodiments described herein exhibit improved accuracy, reliability and/or cost efficiency. This is because the delivery orifices may dispense only the necessary amount of the cooling fluid to only the electronic component, or the portion thereof, which requires cooling. These features also provide for accurate delivery of cooling fluid at precise and controllable rates, because the flow of cooling fluid may be regulated automatically as the ambient environmental properties change. For example, as an electronic component radiates more heat, one or more delivery orifice(s) in the vicinity of the electronic component may be opened to dispense cooling fluid to the electronic component. As the cooling fluid acts on the electronic component and the temperature is reduced, the one or more delivery orifices may be closed automatically to release less cooling fluid. Therefore, the flow of cooling fluid is regulated automatically by ambient environmental conditions without the need for active mechanical or electric control systems. Moreover, cooling fluid is dispensed only from the delivery orifice(s) nearest the electronic component, which requires cooling. In this manner, the cooling fluid is dispensed only when needed. In addition, the cooling systems described herein reduce or eliminate noise and vibration, which are inherent in systems that utilize fans for cooling.

With reference to FIG. 1, there is shown a passive cooling system 100, according to an embodiment. It should be understood that the following description of the passive cooling system 100 is but one manner of a variety of different manners in which such a passive cooling system 100 may be configured. In addition, it should be understood that the passive cooling system 100 may include additional elements and devices not shown in FIG. 1 and that some of the features described herein may be removed and/or modified without departing from a scope of the passive cooling system 100.

As shown, the passive cooling system 100 includes a conduit 102 having a plurality of delivery orifices 105a-c. The delivery orifices 105a-c are controlled by respective hydrogel mechanisms 104a-104c. The conduit 102 comprises a pipe, tube, or similar device configured to transport cooling fluid there through. In an embodiment, the cooling fluid may be pressurized, either by the force of gravity or by actively putting the cooling fluid under additional pressure. While the conduit 102 is depicted in FIG. 1 has having three delivery orifices 105a-c, a person having ordinary skill in the art will appreciate that the conduit 102 may have any reasonably suitable number of delivery orifices 105a-n (where n is any positive integer).

The hydrogel mechanisms 104a-c are configured to individually control each of the respective delivery orifices 105a-c to automatically regulate flow of the cooling fluid through each of the plurality of delivery orifices 105a-c. As mentioned above, the hydrogel mechanisms 104a-c each contain a hydrogel material, which automatically alters its physical state in response to a change in a property of the ambient environment. For example, the volume of the hydrogel material may increase or decrease, the permeability of the hydrogel material may increase or decrease, etc., based upon changes in the ambient environment. Various examples of hydrogel mechanisms 104a-c are provided herein below.

The hydrogel material may comprise any reasonably suitable material that alters its physical state in response to a change in environmental property. For example, the hydrogel materials used in the hydrogel mechanisms 104a-c may include polyethylene (PE), a PE/Docosane mixture, poly(N-isopropylacrylamide), poly(vinylpyrrolidone) (PVP), etc. One or more properties of an ambient environment, such as temperature, pressure, pH, humidity, etc. may cause the alteration in the state of the hydrogel material. For instance, in one embodiment, a change in temperature may cause the hydrogel material to expand, contract, or change its permeability. This physical alteration of the hydrogel material may result in the opening and/or closing of the delivery orifices 105a-c. As such, the flow of cooling fluid may be automatically regulated by the ambient environment of the hydrogel mechanisms 104a-c.

FIG. 1 also shows a plurality of electronic components 106a-c located in respective vicinities of the delivery orifices 105a-c. As shown, each of the delivery orifices 105a-c is configured to have a direct cooling effect on the respective electronic components 106a-c by individually varying the supply of cooling fluid to the respective electronic components 106a-c. That is, the hydrogel mechanism 104a may selectively open or close the delivery orifice 105a, for example, to deliver localized cooling to the electronic component 106a. Similarly, delivery orifices 105b and 105c may be configured to provide cooling fluid to electronic components 106a and 106b, respectively. The delivery orifices 105a-c may be configured to supply the cooling fluid as a spray, drops, stream, mist, vapor, or the like. In this manner, cooling is substantially localized because cooling fluid may be delivered directly to those electronic components 106a-c that require cooling while substantially preventing the supply of cooling fluid to those electronic components 106a-c that do not require cooling.

According to an example, the passive cooling system 100 may be specifically designed to position the hydrogel mechanisms and the delivery orifices 105a-c near particular electronic components 106a-c or portions of electronic components 106ac, which generate heat or may otherwise require cooling. Although three electronic components 106a-c are shown, the passive cooling system 100 may effectively cool any reasonably suitable number of electronic components. In one embodiment, the passive cooling system 100 may comprise a single electronic component and the delivery orifices 105a-n may selectively cool different portions of the single electronic component. In other embodiments, multiple delivery orifices may be configured to cool the same electronic component or the same portion of the electronic component. For instance, if a particular portion of an electronic component is prone to high levels of heat generation, multiple delivery orifices 105a-n may be used to increase the amount of cooling fluid delivered to that portion of the electronic component.

The hydrogel mechanisms 104a-c described herein may reduce or eliminate the need for additional sensors, monitors, and control mechanisms. This is because the ambient environment which causes the hydrogel mechanisms 104a-c alters their physical states may be influenced directly by the effects of an operation of one or more of the electronic component 106a-c. For example, one or more of the electronic components 106a-c, may comprise a computing device, such as a capacitor, a circuit, a central processing unit (CPU), etc., that generates heat as a natural by-product of the normal operation of the computing device. As a computing device, such as the electronic component 106a, for instance, generates heat, the heat is released and subsequently warms up the ambient environment around the electronic component 106a. The heat generated by the electronic component 106a may also increase the temperature of the ambient environment of the nearest hydrogel mechanism 104a. When the temperature change reaches a predetermined threshold, the hydrogel mechanism 104a may open the delivery orifice 105a to dispense cooling fluid to the electronic component 106a.

In this manner, the passive cooling system 100 operates passively because a change to a property of the ambient environment is the stimulus that activates the hydrogel material, which automatically regulates the flow of the cooling fluid through the delivery orifices 105a-c. In other words, the cooling system 100 is not active because it does not require electrical energy to regulate the cooling fluid flow through the delivery orifices 105a-c. The passive cooling system 100 may also provide localized cooling because the cooling fluid may be dispensed from the delivery orifice needed to cool the electronic component that is increasing in temperature, without dispensing cooling fluid from other delivery orifices.

Once the electronic component 106a has cooled, the ambient environment may begin to decrease in temperature, thereby causing the hydrogel mechanism 104a to reversibly alter its state and reduce and/or stop the flow of cooling fluid supplied to the electronic component 106a. The delivery orifices 105a-c may be controlled to obtain fully open or closed positions or any intermediate positions in between fully open and closed depending on the ambient environment. That is, one or more of the hydrogel mechanisms 104a-c may be configured to control the flow of cooling fluid through the delivery orifices in proportion to the level of change of the property of the ambient environment.

Also, in various embodiments, the cooling fluid may be provided to cool the electronic components 106a-c in an open or closed system. FIG. 1 generally illustrates an open system in which the cooling fluid is emitted directly onto the electronic components 106a-c. Ideally, a precise amount of cooling fluid is delivered to the electronic components 106a-c in an open system such that the cooling fluid quickly evaporates and will not saturate, or otherwise impair, the operations of the electronic components 106a-c. However, an open system may also include other feature to accommodate excess cooling fluid, such as drains, catches, reservoirs, etc. An open system may also include devices for capturing evaporated cooling fluid. Such devices may direct the evaporated cooling fluid back into the conduit 102 for immediate re-use or may remove the evaporated cooling fluid from the passive cooling system 100.

In a closed system, on the other hand, the cooling fluid may not come into direct contact with the electronic components. For example, the delivery orifices 105a-c may emit the cooling fluid into a pipe or other transport means, which carries the cooling fluid to the electronic components 106a-c. Instead of contacting the electronic components 106a-c directly, the cooling fluid may flow through, over, under, and/or around the electronic components 106a-c within the pipe to absorb the heat associated with the electronic components 106a-c. The cooling fluid may then be carried away from the electronic components 106a-c for recirculation back into the conduit 102 or to be expelled. Both closed and open systems may utilize refrigeration devices to actively cool and/or re-cool the cooling fluid and pumps to transport the cooling fluid.

Examples of various passive cooling system arrangements will now be described with regard to FIGS. 2-4.

Figure 2:
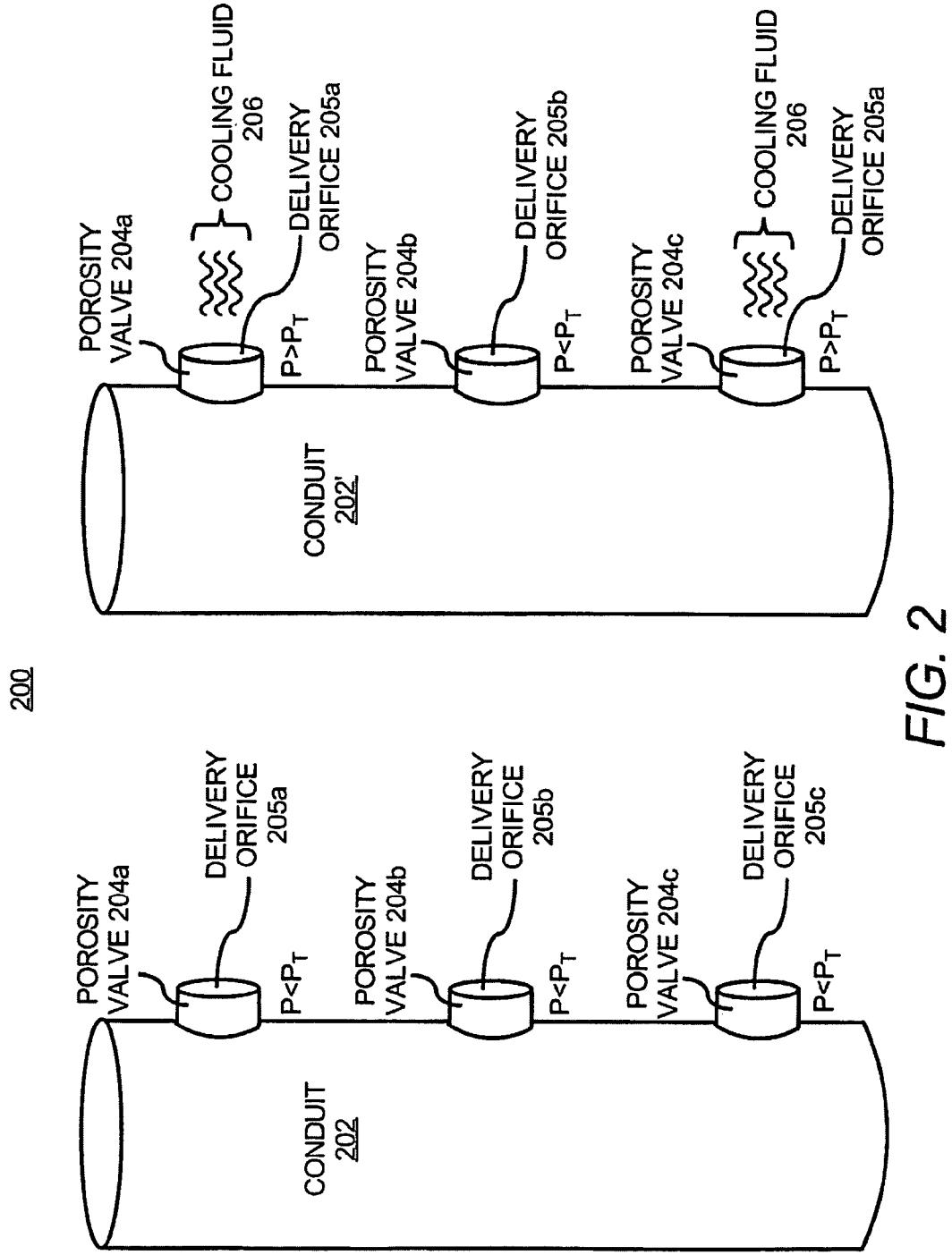
FIG. 2 illustrates a simplified view of a passive cooling system having porosity valves, according to an embodiment.

With reference first to FIG. 2 there is shown a simplified view of a passive cooling system 200 having porosity valves 204a-c, according to an embodiment. It should be understood that the following description of the passive cooling system 200 is but one manner of a variety of different manners in which such a passive cooling system 200 may be configured. In addition, it should be understood that the passive cooling system 200 may include additional elements and devices not shown in FIG. 2 and that some of the features described herein may be removed and/or modified without departing from a scope of the passive cooling system 200.

The passive cooling system 200 includes a conduit 202 having a plurality of delivery orifices 205a-c. The conduit 202 is configured to transport cooling fluid, which may be released from the conduit 202 via the delivery orifices 205a-c. The flow of cooling fluid through the delivery orifices 205a-c may be controlled by porosity values 204a-c, respectively. The porosity valves 204a-c are a type of hydrogel mechanism, similar to the hydrogel mechanisms 104a-c, described above with respect to FIG. 1. Therefore, each of the porosity valves 204a-c comprises a hydrogel material, which is responsive to one or more properties of the ambient environment, as described in greater detail below. While the conduit 202 is depicted in FIG. 2 has having three delivery orifices 205a-c, a person having ordinary skill in the art will appreciate that the conduit 202 may have any reasonably suitable number of delivery orifices 205a-n (where n is any positive integer).

The hydrogel material contained in the porosity valves 204a-c may acts as diffusional switches. That is, the porosity, permeability, or diffusivity of the hydrogel material contained in the porosity valves 204a-c may change in response to a fluctuation in one or more properties of the ambient environment, such as temperature, for instance. For example, while the temperature of the ambient environment is below a certain level, the hydrogel material of the porosity valves 204a-c may have a relatively low permeability, such that little or substantially no cooling fluid is released from the delivery orifices 205a-c. However, as the temperature of the ambient environment increases, the permeability of the porosity valves 204a-c may also increase in proportion to the increase in temperature. Alternatively, or in addition thereto, the hydrogel material of the porosity valves 204a-c may be designed to alter its permeability when the change in temperature reaches a predetermined threshold range. As the permeability increases, the cooling fluid may flow through the porosity valves 204a-c and out of the delivery orifices 205a-c to cool electronic components located nearby.

The conduit 202 shown in the left side of FIG. 2 shows porosity valves 204a-c in a substantially closed position because one or more properties (P) is/are below a property threshold ($P_T$) range, represented by the equation $P<P_T$. While in the closed position, cooling fluid is substantially prevented from being dispensed from the delivery orifices 205a-c. However, the conduit 202' shown in the right side of FIG. 2 depicts that cooling fluid is dispensed when the properties (P) of the ambient environments of the porosity valves 204a and 204c have fluctuated above a property threshold ($P_T$) range. For example, the temperature may have increased above a predetermined threshold ($P_T$) range due to an operation of a computing device located in proximity to the porosity valves 204a and 204c.

The increase of the property above the threshold is represented by the equation $P>P_T$. As the right side of FIG. 2 shows, cooling fluid 206 is released from the porosity valves 204a and 204c to cool electronic devices located near the porosity valves 204a and 204c. A person having ordinary skill in the art will appreciate that the porosity valves 204a-c may be selected or manipulated such that they are configured to dispense cooling fluid at desired property threshold levels, which may depend upon various applications.

The passive cooling system 200 provides an example of localized cooling because only two of the three porosity valves 204a-c shown in the right side of FIG. 2 have been activated. This is because the properties of the local ambient environments surrounding the porosity valves 204a and 204c have changed above the predetermined threshold. The temperature of the local ambient environment of the porosity valve 204b has not risen above a threshold range, which may be an indication that an electronic device located nearest to the delivery orifice 205b does not require cooling. Although not specifically shown in FIG. 2, when the property that triggered the alteration of the hydrogel material of the porosity valves 204a and 204c falls back below the threshold range, the hydrogel material may reversibly decrease in permeability to reduce or stop the flow of cooling fluid 206 from the conduit 202'. The hydrogel material of the porosity valves 204a-c may reversibly increase and decrease in permeability to various opened and closed levels, as well as to any reasonably suitable number of intermediate levels in proportion with a change in one or more properties of the ambient environments of the porosity valves 204a-c.

Figure 3:
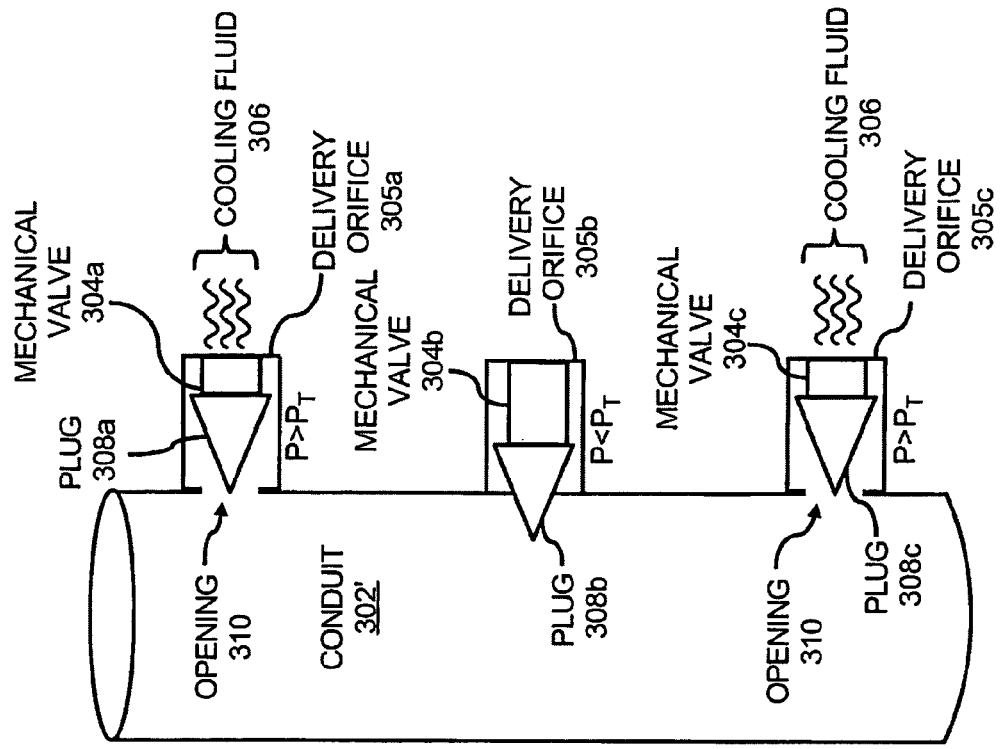
FIG. 3 illustrates a simplified view of a passive cooling system having mechanical valves, according to an embodiment.
Figure 3:
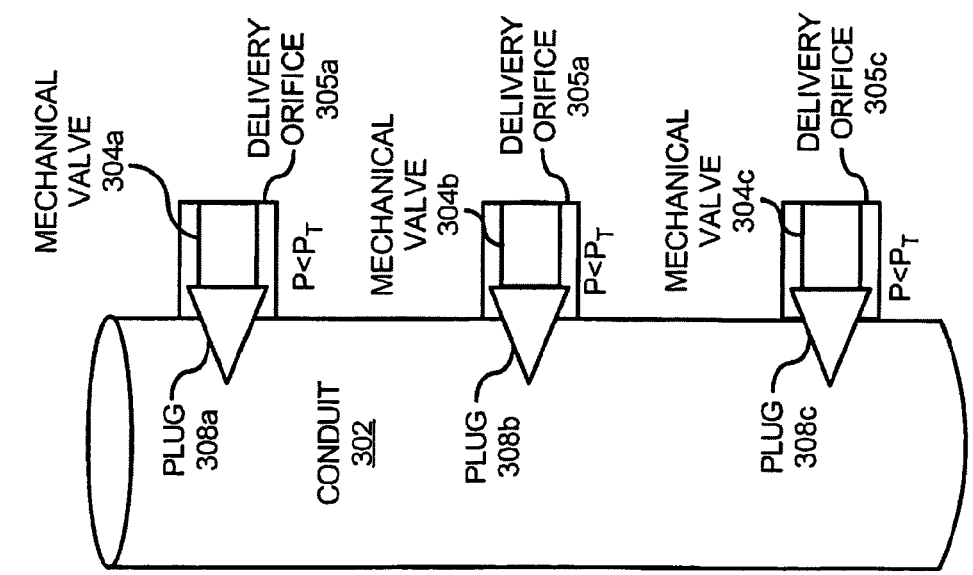

With reference now to FIG. 3, there is shown a simplified view of a passive cooling system 300 having mechanical valves 304a-c, according to an embodiment. It should be understood that the following description of the passive cooling system 300 is but one manner of a variety of different manners in which such a passive cooling system 300 may be configured. In addition, it should be understood that the passive cooling system 300 may include additional elements and devices not shown in FIG. 3 and that some of the features described herein may be removed and/or modified without departing from a scope of the passive cooling system 300.

The passive cooling system 300 includes a conduit 302 having a plurality of delivery orifices 305a-c. The conduit 302 is configured to transport cooling fluid operable to be released from the conduit 302 via the delivery orifices 305a-c. The flow of cooling fluid through each of the delivery orifices 305ac may individually be controlled by each of the mechanical valves 304a-c. The mechanical valves 304a-c are a type of hydrogel mechanism, similar to the hydrogel mechanisms 104a-c, described above with respect to FIG. 1. Therefore, the mechanical valves 304a-c comprise hydrogel materials that are responsive to one or more properties of the ambient environment, as described in greater detail below. While the conduit 302 is depicted in FIG. 3 as having three delivery orifices 305a-c, a person having ordinary skill in the art will appreciate that the conduit 302 may have any reasonably suitable number of delivery orifices 305a-n (where n is any positive integer).

The mechanical valves 304a-c comprise a hydrogel material, which is configured to change in volume in response to a fluctuation in one or more properties of the ambient environment, such as temperature. For example, while the temperature of the ambient environment is below a predetermined threshold range, the hydrogel material of the mechanical valves 304a-c may have a first volume. However, as the temperature of the ambient environment increases, the volume of the hydrogel material in the mechanical valves 304a-c may increase or decrease to a second volume in proportion to the increase in temperature. Alternatively, or in addition thereto, the hydrogel material of the mechanical valves 304a-c may alter its volume when the change in temperature reaches a predetermined threshold range.

As shown, each of the mechanical valves 304a-c includes a plug 308a-c, which is configured to physically block the flow of the cooling fluid through openings 310 in the conduit 302. In an embodiment, the mechanical valves 304a-c may comprise a negative temperature sensitive hydrogel material, which decreases in volume when the temperature of the ambient environment exceeds a threshold range. Therefore, as the temperature increases, the negative temperature sensitive hydrogel may contract to control the movement of one or more of the plugs 308a-c. That is, the plugs 308a-c may be intimately connected to the hydrogel material such that movement of the hydrogel material results in movement of one or more of the plugs 308a-c. For instance, contraction of the hydrogel material may release one or more of the plugs 308a-c from the conduit 302 and allow the cooling fluid to flow through one or more of the delivery orifices 305a-c. Similarly, expansion of thy hydrogel material may move one or more of the plugs 308a-c back into the openings in the conduit 302 to reduce or stop the flow of the cooling fluid through one or more of the delivery orifices 305a-c.

The conduit 302 on the left side of FIG. 3 shows mechanical valves 304a-c in a substantially closed position because one or more properties (P) is/are below a property threshold ($P_T$) range, represented by the equation $P<P_T$. While in the closed position, cooling fluid is substantially prevented from being dispensed from the openings 310 in the conduit 302. However, in the conduit 302' shown in the right side of FIG. 3, cooling fluid 306 is depicted as being dispensed when the properties (P) of the ambient environments of the mechanical valves 304a and 304c have fluctuated above a property threshold ($P_T$) range. For example, the temperature may have increased above a predetermined threshold due to an operation of a computing device located in the vicinity of the mechanical valves 304a and 304c. The increase of the property above the threshold is represented by the equation $P>P_T$. As the right side of FIG. 3 shows, cooling fluid 306 is released through the mechanical valves 304a and 304c to cool electronic devices located near the mechanical valves 304a and 304c. A person having ordinary skill in the art will appreciate that the mechanical valves 304a-c may be designed to include appropriate hydrogel materials, such that they are configured to dispense cooling fluid at desired property threshold levels, which may depend upon various applications.

In an embodiment, the hydrogel material may be in connection with the ends of the mechanical valves 304a-c nearest the delivery orifices 305a-c, which may or may not contain a fluid to keep the hydrogel material hydrated. The fluid in the mechanical valves 304a-c may be engineered to have a thermal conductance that can produce a lag in the response time of the hydrogel material to the ambient temperature. The physical constraint of the expanded hydrogel material and the plugs 308a-c in the mechanical valves 304a-c hold the respective plugs 308a-c into the conduit. As described above, when the local temperature exceeds the $P_T$, the hydrogel material contracts. Since the hydrogel material is attached to the end of the mechanical valves 304a-c, or simply by the pressure of the cooling fluid 306 in the conduit 302', the plugs 308a and 308c are removed from the openings 310 in the conduit 302' and the cooling fluid 306 is released through the delivery orifices 305a-c.

The passive cooling system 300 provides an example of localized cooling because only two of the three mechanical valves 304a-c shown in the right side of FIG. 3 have been activated. This is because the properties of the local ambient environments surrounding the mechanical valves 304a and 304c have changed above the predetermined threshold range. The temperature of the local ambient environment of the mechanical valve 304b has not risen above a threshold range, which may be an indication that an electronic device closest to the vicinity of the delivery orifice 305b does not require cooling. Although not specifically shown in FIG. 3, when the property that triggered the hydrogel material of the mechanical valves 304a and 304c falls back below the threshold range, the hydrogel material may expand to physically push the plugs 308a and 308c, respectively, back into the conduit 302', thereby closing the openings 310. The hydrogel material of the mechanical valves 304a-c may reversibly expand and contract to various opened and closed positions, as well as to any reasonably suitable number of intermediate positions in proportion with a change in one or more properties of the ambient environments of the mechanical valves 304a-c.

Figure 4:
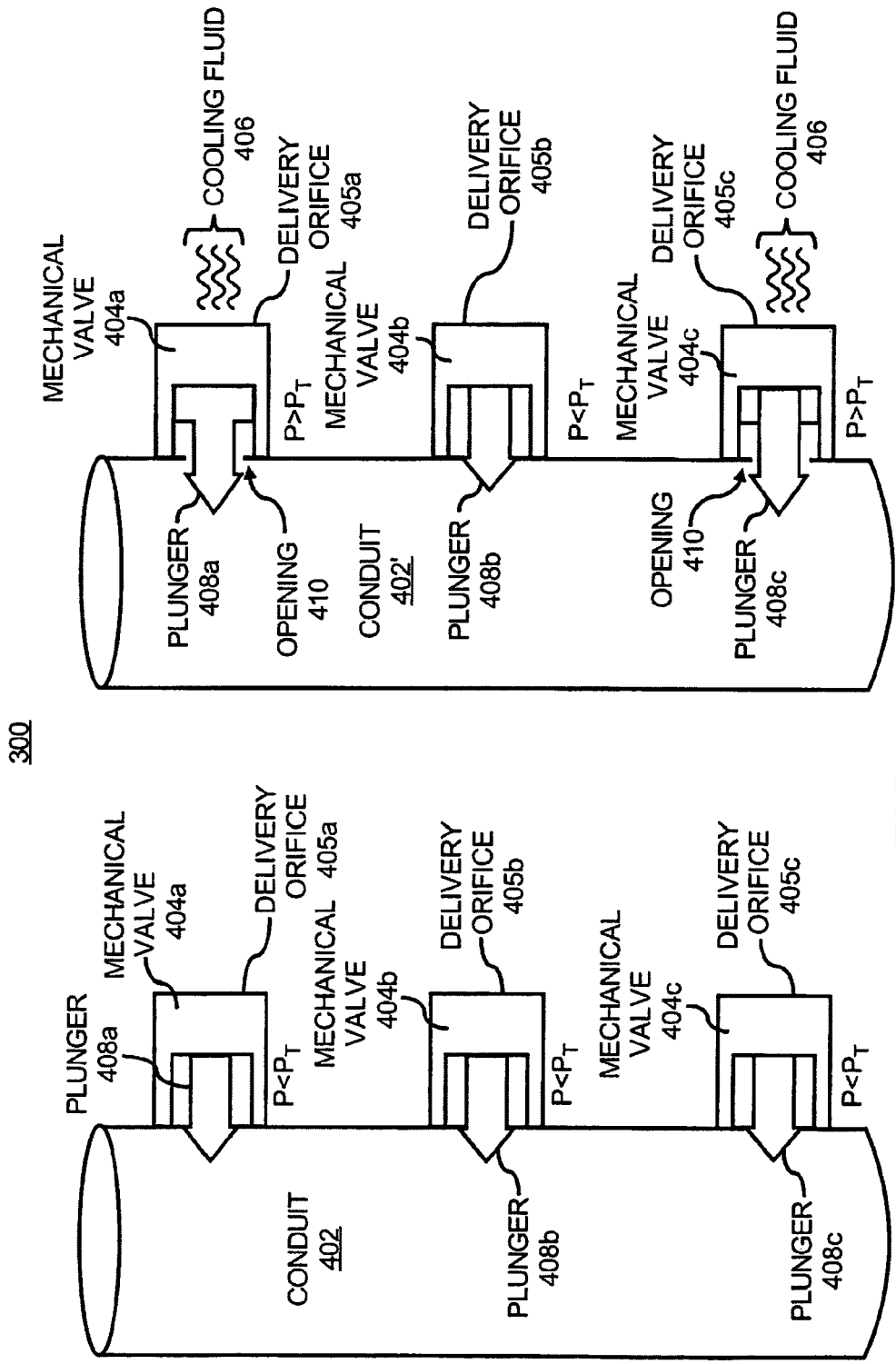
FIG. 4 illustrates a simplified view of a passive cooling system having mechanical valves, according to another embodiment.

With reference now to FIG. 4 there is shown a simplified view of a passive cooling system 400 having mechanical valves 404a-c, according to another embodiment. It should be understood that the following description of the passive cooling system 400 is but one manner of a variety of different manners in which such a passive cooling system 400 may be configured. In addition, it should be understood that the passive cooling system 400 may include additional elements and devices not shown in FIG. 4 and that some of the features described herein may be removed and/or modified without departing from a scope of the passive cooling system 400.

The passive cooling system 400 includes a conduit 402 having a plurality of delivery orifices 405a-c. The conduit 402 is configured to transport cooling fluid operable to be released from the conduit 402 via the delivery orifices 405a-c. The flow of cooling fluid through the delivery orifices 405a-c may individually be controlled by each of the mechanical valves 404a-c. The mechanical valves 404a-c are a type of hydrogel mechanism, similar to the hydrogel mechanisms 104a-c, described above with respect to FIG. 1. Therefore, the mechanical valves 404a-c comprise hydrogel materials that are responsive to one or more properties of the ambient environment, as described in greater detail below. While the conduit 402 is depicted in FIG. 4 has having three delivery orifices 405a-c, a person having ordinary skill in the art will appreciate that the conduit 402 may have any reasonably suitable number of delivery orifices 405a-n (where n is any positive integer).

The mechanical valves 404a-c comprise a hydrogel material, which is configured to change in volume in response to a fluctuation in one or more properties of the ambient environment, such as temperature. For example, while the temperature of the ambient environment is below a predetermined threshold range, the hydrogel material of the mechanical valves 404a-c may have a first volume. However, as the temperature of the ambient environment increases, the volumes of the mechanical valves 204a-c may increase in proportion to the increase in temperature.

Each of the mechanical valves 404a-c includes a respective plunger 408a-c, which is configured to physically block the flow of the cooling fluid from the conduit 402. In an embodiment, the mechanical valves 404a-c may comprise a positive temperature sensitive hydrogel material, which increases in volume when the temperature exceeds a threshold range. Therefore, as the temperature increases, the positive temperature sensitive hydrogel may expand to push the plungers 408a-c farther into the conduit 402 and allow the cooling fluid to flow through the openings 410 in the conduit 402 and out of the delivery orifices 405a-c.

The conduit 402 on the left side of FIG. 4 shows mechanical valves 404a-c in a substantially closed position because one or more properties (P) is/are below a property threshold ($P_T$) range, represented by the equation $P<P_T$. While in the closed position, cooling fluid is substantially prevented from being dispensed from the openings 410 in the conduit 402. However, in the conduit 402' shown in the right side of FIG. 4, cooling fluid 406 is depicted as being dispensed when the properties (P) of the ambient environments of the mechanical valves 404a and 404c have fluctuated above a property threshold ($P_T$) range. For example, the temperature may have increased above a predetermined threshold range due to an operation of a computing device located in the vicinity of the mechanical valves 404a and 404c. The increase of the property above the threshold range is represented by the equation $P>P_T$. As the right side of FIG. 4 shows, cooling fluid 406 is released through the mechanical valves 404a and 404c to cool electronic devices located near the mechanical valves 404a and 404c. A person having ordinary skill in the art will appreciate that the mechanical valves 404a-c may include appropriate hydrogel materials, such that they are configured to dispense cooling fluid at desired property threshold ranges, which may depend upon various applications.

The passive cooling system 400 provides another example of localized cooling, because only two of the three mechanical valves 404a-c shown in the right side of FIG. 4 have been activated. This is because the properties of the local ambient environments surrounding the mechanical valves 404a and 404c have changed above a threshold range. The temperature of the local ambient environment of the mechanical valve 404b has not risen above a threshold range, which may be an indication that an electronic device closest to the vicinity of the delivery orifice 405b does not require cooling. Although not specifically shown in FIG. 4, when the property that triggered the hydrogel material of the mechanical valves 404a and 404c falls back below the threshold range, the hydrogel material may contract to physically pull the plungers 408a and 408c, respectively, back into contact with the conduit 402' and block the flow of the cooling fluid 406 through the openings 410. Alternatively, or in addition thereto, the plungers 408a and 408c may move under the pressure of the cooling fluid 406 in the conduit 402'. The hydrogel material of the mechanical valves 404a-c may reversibly expand and contract to various opened and closed positions, as well as to any reasonably suitable number of intermediate positions in proportion with a change in one or more properties of the ambient environments of the mechanical valves 404a-c.

Figure 5:
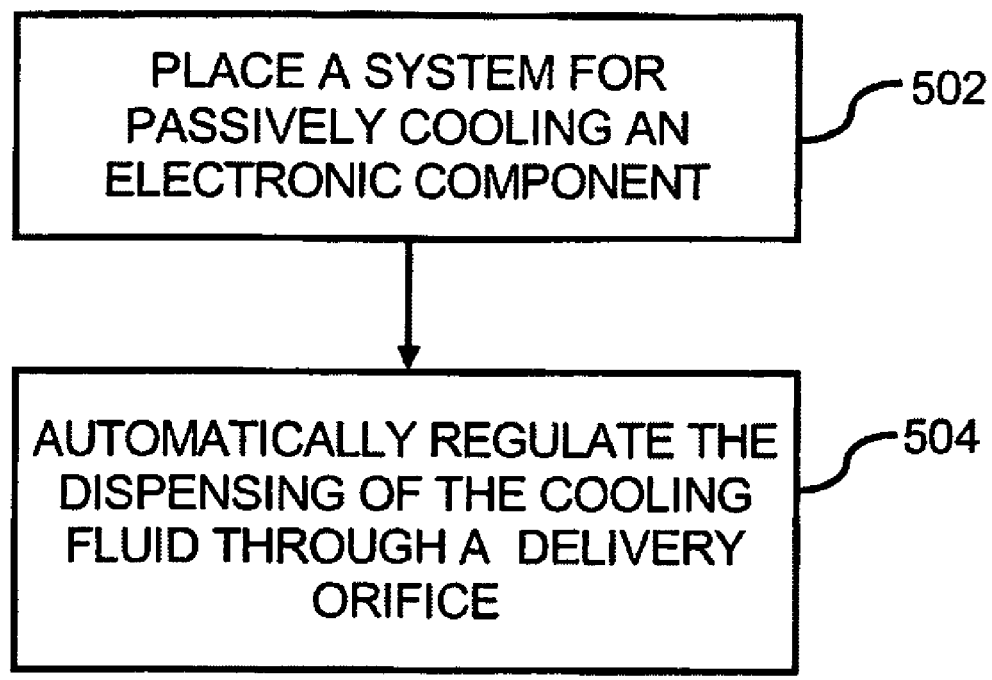
FIG. 5 illustrates a flowchart of method for passively cooling an electronic component, according to an embodiment.

FIG. 5 illustrates a flowchart for a method 500 for passively cooling an electronic component, according to an embodiment. It is to be understood that the following description of the method 500 is but one manner of a variety of different manners in which an example of the invention may be practiced. It should also be apparent to those of ordinary skill in the art that the method 500 represents a generalized illustration and that other steps may be added or existing steps may be removed, modified or rearranged without departing from a scope of the method 500.

The description of the method 500 is made with reference to the passive cooling systems 100, 200, 300, and 400 illustrated in FIGS. 1-4 and thus makes reference to the elements cited therein. It should, however, be understood that the method 500 is not limited to the passive cooling systems 100, 200, 300, and 400. Instead, it should be understood that the method 500 may be used with systems having a different configuration than the passive cooling systems 100, 200, 300, and 400 set forth in FIGS. 1-4.

The method 500 may be initiated at step 502 where a passive cooling system is placed in the general vicinity of an electronic component. The phrase "in the general vicinity" refers to a location in which the cooling system may have a cooling effect on the electronic component. For example, the cooling system may be located above the electronic component such that the cooling system is configured to dispense a cooling fluid onto the electronic component.

The cooling system may include a conduit 102, 202, 302, or 402 configured to carry a pressurized cooling fluid. The conduit may include a plurality of delivery orifices 105a-c, 205a-c, 305a-c, or 405a-c configured to dispense the pressurized cooling fluid from the conduit to cool the electronic component. Each of the plurality of delivery orifices may include a hydrogel mechanism 104a-c associated therewith. The hydrogel mechanism may comprise a porosity valve 204a-c or a mechanical valve 304a-c or 404a-c having a hydrogel material. The hydrogel mechanism is configured to individually control the plurality of delivery orifices to regulate the dispensing of the cooling fluid from the delivery orifices automatically in response to a variation in at least one property of an ambient environment surrounding the hydrogel mechanism.

At step 504, the dispensing of the cooling fluid through the delivery orifice is automatically regulated in response to the detection of the change in the property of the ambient environment. For example, cooling fluid may be released from the delivery orifice to cool the electronic component or the delivery orifice may be closed to reduce or stop the flow of cooling fluid therefrom at step 504. As described above, the hydrogel material may increase or decrease in permeability and/or in volume. The environmental property causing the alteration in the state of the hydrogel material may be temperature, pH, humidity, or the like, which may be influenced by an operation of the electronic component. For instance, the electronic component may be a computing device which generates heat during normal operating conditions and may thus cause the hydrogel material to change its permeability and/or its volume.

Although the embodiments have been described above with reference to a cooling fluid for cooling electronic components, a person having ordinary skill in the art will appreciate that the various embodiments may be practiced with any fluid, which may be dispensed for any reasonably suitable purposes. For instance, cooling fluid may be dispensed from the systems described herein to cool individuals. In an embodiment, the systems described herein may be placed in environments, in particular outdoor environments, where individuals are often located, such as theme parks, playgrounds, etc. As the ambient environment exceeds a predetermined threshold range, the systems may dispense water to cool individuals. For instance, the predetermined threshold range may be an uncomfortable temperature or humidity level. When a property of the environment reaches the uncomfortable levels, the systems may automatically dispense a fluid in an effort to return the environment to a more comfortable level. Hydrogel materials, which are responsive to temperature and humidity levels may also be used other applications, such as irrigation to automatically provide water, fertilizer, and/or other fluids to crops, plants, trees, and the like.

In another example, hydrogel materials which respond to temperature and/or humidity levels in their ambient environment may be used in wineries to maintain properties of an environment, particularly humidity, at desired levels. In other embodiments, hydrogels responsive to pH levels may be utilized to regulate aquatic environments, such as pools, spas, aquariums, fisheries, etc. When pH levels rise above or fall below desired levels, the systems described herein may automatically release or absorb chemicals to regulate the pH of the aquatic environments.

While the embodiments have been described with reference to examples, those skilled in the art will be able to make various modifications to the described embodiments without departing from the scope of the claimed embodiments.

What is claimed is:

1. A system for passively cooling an electronic component, said system comprising:
    a conduit configured to carry a pressurized cooling fluid, wherein the conduit comprises a plurality of delivery orifices configured to dispense the pressurized cooling fluid from the conduit and cool the electronic component; and
    a hydrogel mechanism associated with each of the plurality of delivery orifices, wherein the hydrogel mechanism is configured to individually control each of the plurality of delivery orifices to automatically regulate flow of the cooling fluid from each of the plurality of delivery orifices in proportion to a variation in at least one of temperature and pH of an ambient environment surrounding the hydrogel mechanism, wherein the at least one of temperature and pH of the ambient environment is influenced by an operation of the electronic component.

2. The system of claim 1, wherein the hydrogel mechanism comprises a hydrogel material having a physical state, wherein the physical state is alterable in response to the variation in the at least one of temperature and pH of the ambient environment.

3. The system of claim 2, wherein the physical state comprises one of permeability and volume.

4. The system of claim 1, wherein the hydrogel mechanism comprises a porosity valve having a hydrogel material configured to reversibly increase permeability to allow the cooling fluid to be released from the conduit and flow through the hydrogel material in response to a-variation in the property of an ambient environment surrounding the hydrogel mechanism exceeding a predetermined threshold range.

5. The system of claim 1, wherein the hydrogel mechanism comprises a negative temperature sensitive hydrogel material configured to reversibly decrease in volume in response to an increase in temperature above a threshold range.

6. The system of claim 5, wherein the decrease in volume of the negative temperature sensitive hydrogel material controls movement of a plug to reversibly release the plug from the conduit to allow the cooling fluid to flow through one of the plurality of delivery orifices.

7. The system of claim 1, wherein the hydrogel mechanism comprises a positive temperature sensitive hydrogel material configured to increase in volume in response to an increase in temperature above a threshold range.

8. The system of claim 7, wherein the increase in volume of the positive temperature sensitive hydrogel material pushes a plunger into the conduit to allow the cooling fluid to flow through one of the plurality of delivery orifices.

9. The system of claim 1, further comprising:
    an electronic component, wherein the electronic component generates heat during operation thereof.

10. The system of claim 9, wherein the hydrogel mechanism is further configured to dispense cooling fluid from at least one of the plurality of delivery orifices into one of a closed system, wherein the cooling fluid does not have direct contact with the electronic component, and an open system, wherein the cooling fluid directly contacts the electronic component.

11. A method for passively cooling an electronic component, said method comprising:
    placing a system for passively cooling the electronic component, wherein the system includes,
        a conduit configured to carry a pressurized cooling fluid, wherein the conduit includes a plurality of delivery orifices configured to dispense the pressurized cooling fluid from the conduit and cool the electronic component, and a hydrogel mechanism associated with each of the plurality of delivery orifices, wherein the hydrogel mechanism includes a hydrogel material configured to individually control the plurality of delivery orifices to regulate the dispensing of the cooling fluid from the delivery orifices automatically in proportion to a variation in at least one of temperature and pH of an ambient environment surrounding the hydrogel mechanism; and automatically regulating dispensing of the cooling fluid through the delivery orifice associated with the at least one hydrogel mechanism in proportion to a change in the at least one of temperature and pH that exceeds a predetermined level.

12. The method of claim 11, wherein automatically regulating dispensing of the cooling fluid further comprises automatically altering a physical state of the hydrogel material.

13. The method of claim 12, wherein automatically altering a physical state of the hydrogel material further comprises automatically altering a physical state selected from permeability and volume of the hydrogel material.

14. The method of claim 11, wherein the hydrogel mechanism comprises a porosity valve and wherein automatically regulating the dispensing of cooling fluid further comprises reversibly increasing a permeability of the hydrogel material to allow the cooling fluid to be released from the conduit and flow through the hydrogel material.

15. The method of claim 11, wherein the hydrogel mechanism comprises a negative temperature sensitive hydrogel material and a plug and wherein automatically regulating the dispensing of cooling fluid further comprises reversibly decreasing a volume of the hydrogel material to release the plug from the conduit in response to an increase in temperature above a threshold range.

16. The method of claim 11, wherein the hydrogel mechanism comprises a positive temperature sensitive hydrogel material and a plunger and wherein automatically regulating the dispensing of cooling fluid further comprises reversibly increasing a volume of the hydrogel material to push the plunger into the conduit in response to an increase in temperature above a threshold range.

17. The method of claim 11, wherein automatically regulating dispensing of the cooling fluid through the delivery orifice comprises dispensing the cooling fluid to cool a selected portion of the electronic component.

18. The method of claim 11, wherein the plurality of delivery orifices comprises the delivery orifice associated with the at least one hydrogel mechanism and a second delivery orifice located in a position adjacent to the delivery orifice associated with the at least one hydrogel mechanism and automatically regulating the flow of the cooling fluid through the delivery orifice associated with the at least one hydrogel mechanism comprises releasing the cooling fluid from the delivery orifice associated with the at least one hydrogel mechanism while reducing an amount of the cooling fluid flowing through the second delivery orifice.

19. A system for passively cooling a computing device, said system comprising:

means for carrying a cooling fluid to a plurality of delivery orifices, said plurality of delivery orifices being aligned to supply the cooling fluid to an electronic component; and means for automatically regulating the release of cooling fluid from the means for carrying through the plurality of delivery orifices in proportion to a variation in at least one of temperature and pH of an ambient environment surrounding the means for automatically regulating that exceeds a predetermined threshold range.

20. The system of claim 19, wherein the means for automatically regulating comprises a hydrogel material configured to become physically altered when the ambient environment exceeds the predetermined threshold range.

* * * * *

UNITED STATES PATENT AND TRADEMARK OFFICE
CERTIFICATE OF CORRECTION

PATENT NO.        : 8,028,743 B2
APPLICATION NO.   : 12/249568
DATED             : October 4, 2011
INVENTOR(S)       : Janice H Nickel Page 1 of 1

It is certified that error appears in the above-identified patent and that said Letters Patent is hereby corrected as shown below:

In the Claims

In column 12, line 32, in Claim 4, delete "a-variation" and insert -- a variation --, therefor.

Signed and Sealed this
Twenty-seventh Day of May, 2014

Michelle K. Lee
*Deputy Director of the United States Patent and Trademark Office*